US006427158B1

(12) United States Patent
Wang et al.

(10) Patent No.: US 6,427,158 B1
(45) Date of Patent: Jul. 30, 2002

(54) FIR DECIMATION FILTER AND METHOD

(75) Inventors: Binan Wang, Tucson, AZ (US); Souichirou Ishizuka, Hadano (JP)

(73) Assignee: Texas Instruments Incorporated, Dallas, TX (US)

( * ) Notice: Subject to any disclaimer, the term of this patent is extended or adjusted under 35 U.S.C. 154(b) by 50 days.

(21) Appl. No.: 09/737,150

(22) Filed: Dec. 14, 2000

(51) Int. Cl.⁷ .......................... G06F 17/17; G06F 17/10
(52) U.S. Cl. ...................... 708/313; 708/319
(58) Field of Search ................. 708/300, 301, 708/313, 319

(56) References Cited

U.S. PATENT DOCUMENTS

| | | | |
|---|---|---|---|
| 3,980,873 A | * 9/1976 | Mattei | 708/315 |
| 4,817,025 A | 3/1989 | Asai et al. | |
| 4,841,828 A | * 6/1989 | Suzuki | 84/601 |
| 4,974,186 A | 11/1990 | Duhamel et al. | |
| 5,153,846 A | 10/1992 | Rao | |
| 5,170,368 A | 12/1992 | Hattori | |
| 5,191,547 A | 3/1993 | Kawamoto et al. | |
| 5,193,070 A | 3/1993 | Abiko et al. | |
| 5,297,069 A | 3/1994 | Asato et al. | |
| 5,402,445 A | 3/1995 | Matsuura | |
| 5,617,344 A | 4/1997 | Young et al. | |
| 5,696,708 A | 12/1997 | Leung | |
| 5,708,596 A | 1/1998 | Sato | |
| 5,717,619 A | 2/1998 | Spurbeck et al. | |
| 5,771,185 A | 6/1998 | Miyake et al. | |
| 5,838,725 A | 11/1998 | Gurusami et al. | |
| 5,886,913 A | 3/1999 | Marguinaud et al. | |
| 5,909,383 A | 6/1999 | Lee | |
| 5,910,908 A | 6/1999 | Slavin | |
| 5,912,827 A | 6/1999 | Sasaki | |
| 6,041,339 A | 3/2000 | Yu et al. | |

OTHER PUBLICATIONS

"A 16–bit Oversampling A–to–D Conversion Technology Using Triple–Integration Noise Shaping" by Matsuya et al., IEEE Journal of Solid State Circuits, vol. SC–22, No. 6, Dec. 1987, pp. 921–929.

* cited by examiner

Primary Examiner—Chuong Dinh Ngo
(74) Attorney, Agent, or Firm—W. Daniel Swayze, Jr.; W. James Brady; Frederick J. Telecky, Jr.

(57) ABSTRACT

An FIR decimation filter includes the a shift register (51) including M flip-flops arranged in M/R rows (52, 54, 56, 58) of R bits each, wherein M/R is an integer and R is the decimation ratio of the FIR decimation filter. The shift register has an input for receiving serial digital input information. Half of the rows are sequentially arranged in an upper section and the other half of the rows are arranged sequentially in a lower section. Each row has a left tap and a right tap. The shift register includes a bidirectional shift register in the top row of the lower section. A control circuit (70) controls shifting operations which each shift input data and data present in the shift register (51) by R bits so as to load a new group of R bits into each row. M/(2R) pre-adders (57, 59) each have first and second inputs connected to the right tap points of symmetrically opposite rows of the upper section and lower section, respectively and arithmetic circuit (60,62) is coupled to receive output information from the pre-adders and effectively multiplying the output information by the coefficient information. An accumulator circuit (74) is coupled to accumulate information from an output of the arithmetic circuit and output the accumulated information as a filtered, decimated representation of the serial digital input information.

11 Claims, 5 Drawing Sheets

FIR DECIMATION FILTER AND METHOD

BACKGROUND OF THE INVENTION

The invention relates to use of FIR filters as decimation filters, and more particularly to a FIR decimation filter which allows a reduction in the amount of integrated circuit chip area required, and which also reduces power dissipation, especially for high-performance applications.

Prior art FIG. 1 shows a conventional finite impulse response filter 2. (Finite impulse response filters are hereinafter referred to as FIR filters.) FIR filter 2 includes a suitable number of delay elements 4,6,8 . . . 14 connected sequentially, so that the input signal IN is applied to the input of delay element 4, the output of which is connected to the input of delay element 6. The output of delay element 6 is connected to the input of the next delay element 8, and so forth. Each of the delay elements "corresponds" to another of the delay elements so as to accomplish a desired filtering operation. For example, the first delay element 4 corresponds to the last delay element 14, and the second delay element 6 corresponds to the next-to-last delay element 12, and so forth. One commonly used type of FIR filter is a linear phase filter. The coefficients of a linear phase filter have symmetric features, and because of the symmetric features, the corresponding data bits referred to can be advantageously paired prior to reduce the number of multiplications required.

Specifically, outputs of the corresponding delay elements are added together, and the resulting sum is multiplied by a coefficient. For example, the outputs of corresponding delay elements 4 and 14 are added together by adder 16, and the result is multiplied by a first coefficient a1 by means of a first multiplier 17. Similarly, the outputs of corresponding delay elements 6 and 12 are added by adder 18, and the resulting sum is multiplied by a coefficient a2 by means of a multiplier 19, and so forth. The results of the adding operations and coefficient multiplication operations then are all summed by an adder 22 to produce an output signal OUT. The delay elements typically are implemented by using D-type flip-flops, which when connected as described above, constitute a shift register in which the flip-flop outputs constitute tap points. At least one adder, such as adder 16, and at least one multiplier, such as multiplier a1, are required for each corresponding pair of flip-flops, if the adder and multiplier are operating at the same speed as the rate at which the incoming data is being clocked into the shift register.

However, the fact that the output rate of a decimation filter is much lower than its input rate usually allows some hardware, especially adders and multipliers, to be shared in a simplified design. If the multipliers and associated accumulators are allowed to operate at multiples of the rate at which the incoming data is being clocked into the shift register, then multiple pairs of flip-flops of the shift register can share the same multiplier and accumulator circuitry.

Nevertheless, each D-type flip-flop in prior art FIG. 1 still needs to be individually accessed with corresponding control circuitry to accomplish the required pre-adding, and also needs to transfer its content to the next successive D-type flip-flop. The excessive wiring, complex routing, and corresponding control logic circuitry of the FIR filter shown in FIG. 1 result in excessive use of surface area on an integrated circuit chip.

Prior art FIG. 2 shows another 16 tap FIR filter 30, which is implemented as a "dual-loop shift register" that may be used in some analog-to-digital converters. As shown in part (a) of FIG. 2, the dual loop shift register 30 includes a first shift register chain 38 in which data bits Z1,2 . . . 8 are stored, and a second shift register chain 36 in which data bits Z9,10 . . . 16 are stored. The output of flip-flop Z8 is provided as an output at end 34 of shift register chain 38 and also is connected to the input of flip-flop Z16. Bit Z9 provided as an output at end 34 of shift register chain 36.

The configuration illustrated in parts (a)–(d) of FIG. 2 is for a 16-bit oversampling analog-to-digital converter (ADC). With FIR filter 30 implemented as a dual-loop shift register, data signals Zi, wherein the index I is equal to 0,1,2 . . . , are accessed only at the ends 32 and 34 of shift register chains 36 and 38. Larger values of the index letter I correspond to the most recent values of the bits Zi of the incoming input data signal. The flow of data through FIR filter 30 is illustrated in the sequence shown in FIG. 2, the initial state of FIR filter 30 being shown in part (a) of FIG. 2. After one data shift or clock cycle, the data bits are located as shown in part (b) of FIG. 2. After the next seven data shifting operations, the 16-bit shift register is operationally configured as shown in part (c) of FIG. 2. After one more clock cycle, the output of the shift register chain 38 is connected to the input of shift register chain 36 again, as shown in part (d) of FIG. 2, to start a new cycle. This operation aligns the shifted data so that corresponding bits of data can be added in a fashion analogous to that for the FIR filter of prior art FIG. 1.

Although the shift register configuration of FIG. 2 may require less surface area of an integrated circuit chip because it does not require routing of the output of each flip-flop of each shift register chain to the various adders as in the prior art FIR filter of FIG. 1, the FIR filter of FIG. 2 requires calculating mathematical functions by clocking the two shift register chains with a significantly higher speed than the data input rate. In this 16 tap filter, the shift register chain has to be operated at least about eight times faster than the incoming data rate. This high-speed clocking substantially increases power dissipation. Also, in some cases the clocking speed required for calculating the mathematical functions may be too high to be practical using available technology.

U.S. Pat. No. 5,170,368 discloses a digital decimation filter in which shift registers are used to take incoming data. A bank of switches is deployed between the shift registers and the accumulator output to provide, in conjunction with appropriate control circuitry, selective access to the content of the various shift register flip-flops to accomplish the data processing. U.S. Pat. No. 5,838,725 discloses a floating point digital transversal filter in which shift registers are used to take incoming data. The filter output result is generated through a ROM lookup table. U.S. Pat. No. 4,817,025 discloses a digital filter in which shift registers are used to take incoming data. Every register output is used for calculation every clock cycle. The digital filter is used in an interpolation filter. U.S. Pat. No. 5,193,070 discloses a transversal filter circuit having circuits that include bidirectional shift registers for serial multiplication. It is used to shift coefficients up or down for serial multiplication. U.S. Pat. No. 5,297,069 discloses a finite impulse response filter (FIR filter) in which shift registers are replaced by recirculating addressable memory. The shifting structure has feedback, making it a recirculating structure.

SUMMARY OF THE INVENTION

Accordingly, it is an object of the invention to provide an FIR decimation filter which consumes less power and requires less integrated circuit chip area than the above described prior art.

It is another object of the invention to provide a generic design methodology for an FIR decimation filter.

Briefly described, and in accordance with one embodiment thereof, the invention provides an FIR decimation filter including a shift register (51) including M flip-flops arranged in M/R rows (52, 54, 56, 58) of R bits each, wherein M/R is an integer and R is the decimation ratio of the FIR decimation filter. The shift register has an input for receiving serial digital input information. Half of the rows or sequentially arranged in an upper section, and a second half of the rows are arranged sequentially in a lower section. Each row has a left tap and a right tap. A bidirectional shift register (56) is included in the shift register (51). The bidirectional shift register (56) includes the top row of the lower section. A control circuit (70) controls shifting operations so as to shift input data and data present in the shift register (51) by R bits for each shifting operation so as to load a new group of R bits into each row. M/(2R) pre-adders (57, 59) each have first and second inputs connected to the right tap points of symmetrically opposite rows of the upper section and lower section, respectively. Arithmetic circuitry (60,62) is coupled to outputs of the pre-adders to receive output information from the pre-adders and to receive coefficient information and to effectively multiply the output information by the coefficient information. The accumulator circuitry (74) is coupled to accumulate information from an output of the arithmetic circuitry and output the accumulated information as a filtered, decimated representation of the serial digital input information. In the described embodiments, the flip-flops are D-type flip-flops.

DETAILED DESCRIPTION OF THE PREFERRED EMBODIMENTS

Figure 1:
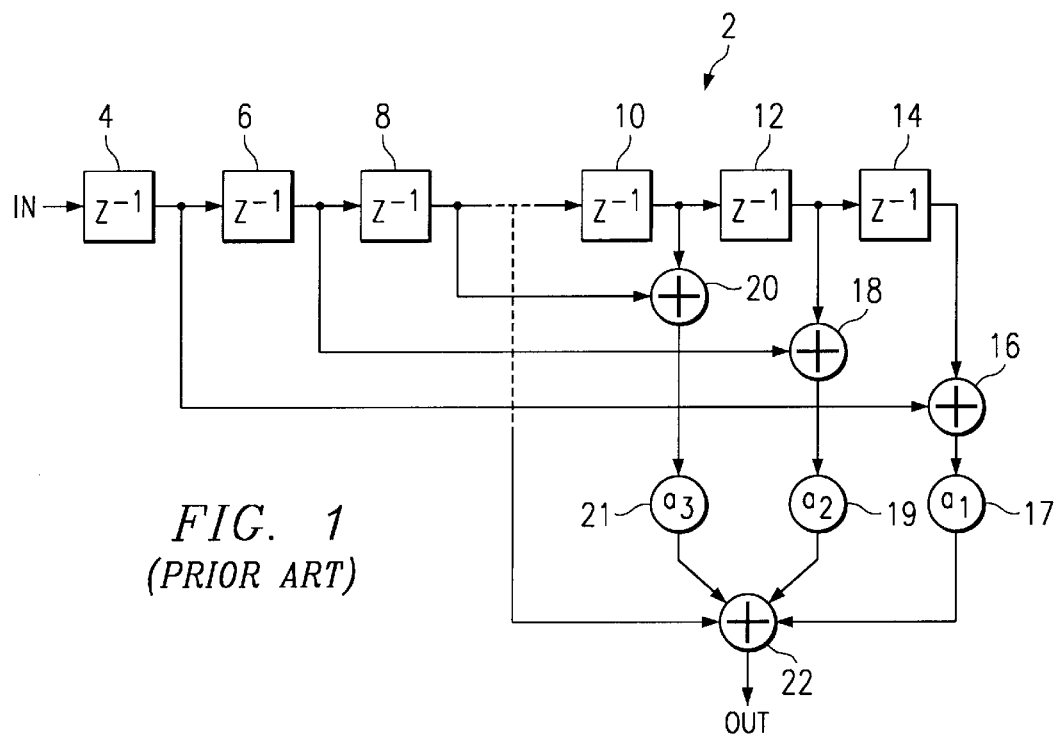
FIG. 1 is a block diagram of a conventional finite impulse response filter (FIR).

The present invention includes the feature of accessing the data signals only at the ends of the shift register rows, as in the structure of prior art FIGS. 2A–D, in order to reduce interconnect complexity that would be required if the structure of prior art FIG. 1 were to be used. The present invention also provides the advantage of enabling the 16-bit shift register 51 of FIG. 3A to shift at the same clock rate as the rate at which input data is shifted into the 16-bit shift register. This provides a substantial savings in power consumption, and also avoids the difficulty of having to provide the very high clock signal speed required by the system of prior art FIG. 2.

Figure 3A:
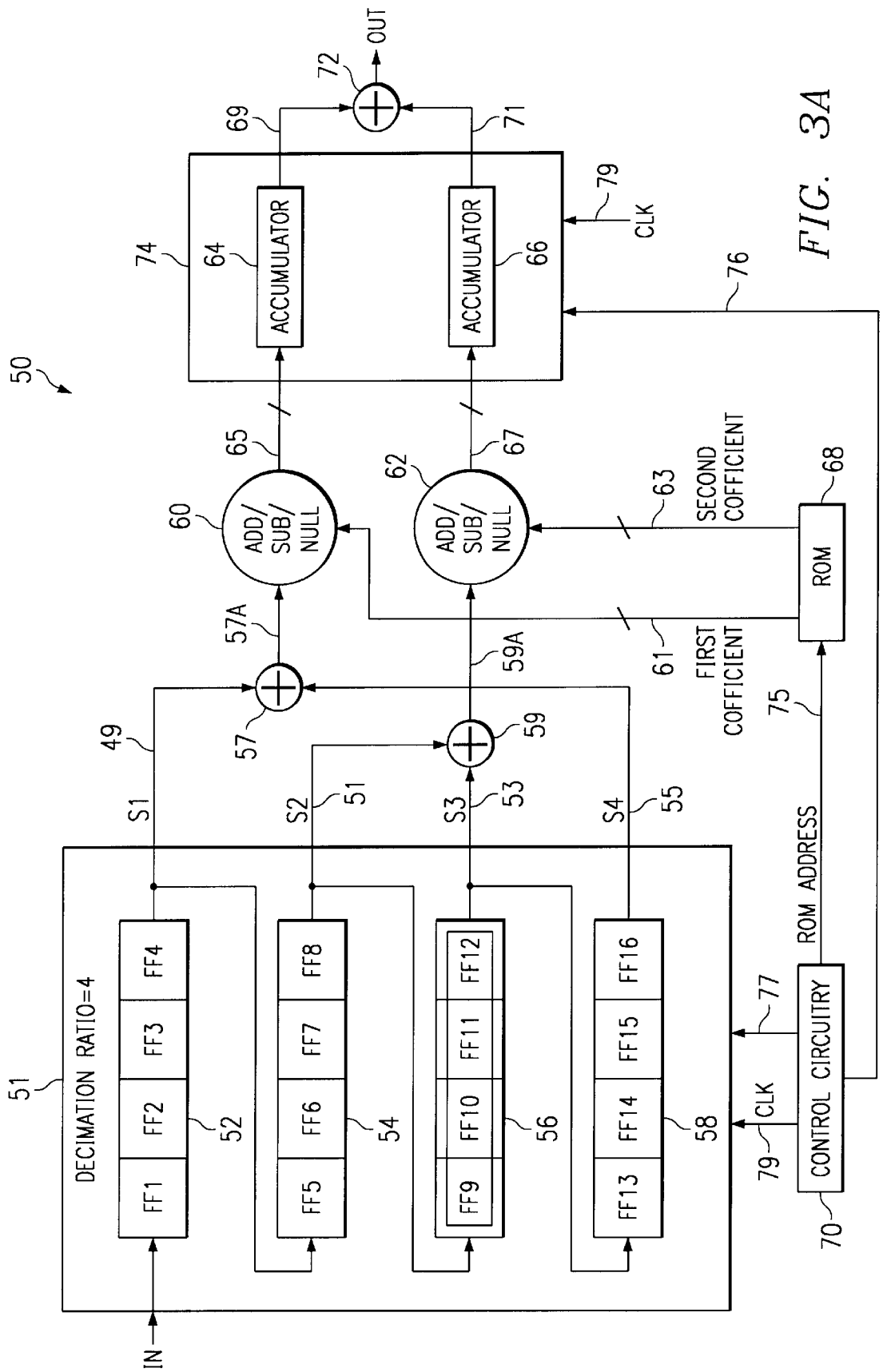
FIG. 3A is a block diagram of a generalized FIR decimation filter according to the present invention.

FIG. 3A illustrates a general view of an FIR decimation filter circuit 50 in accordance with the present invention. The FIR filter circuit shown in FIG. 3A is illustrated for the case of a 16 tap FIR decimation filter with a decimation ratio of 4. A 16 tap shift register 51 includes a number of shift register rows or "slices" 52, 54, 56 and 58, wherein data signals are accessed only at the ends of each of shift register rows 52, 54, 56, and 58.

In FIG. 3A, 16 tap shift register 51 includes sixteen D-type flip-flops FF1,2,3 . . . 16 connected sequentially as illustrated to form a 16-bit shift register. The 16-bit shift register 51 is divided into four 4-bit shift register rows or sections 52, 54, 56, and 58. That is, the total number of taps (i.e., 16) of shift register 51 is divided by the decimation ratio (i.e., 4) of decimation filter 50.

Shift register row or section 52 includes flip-flops FF1, FF2, FF3, and FF4, with the input of flip-flop FF1 receiving the input signal IN. The output of flip-flop FF4 produces a digital signal S1 on conductor 49, which is connected to one input of an adder 57. 16-bit shift register 51 also includes three additional four-bit shift register rows or sections 54, 56, and 58. Section 54 includes flip-flops FF5, FF6, FF7, and FF8, with the input of flip-flop 5 being connected to the output of flip-flop FF4. The output of flip-flop FF8 produces an output signal S2 on conductor 51, which is connected to one input of an adder 59.

Figure 3B:
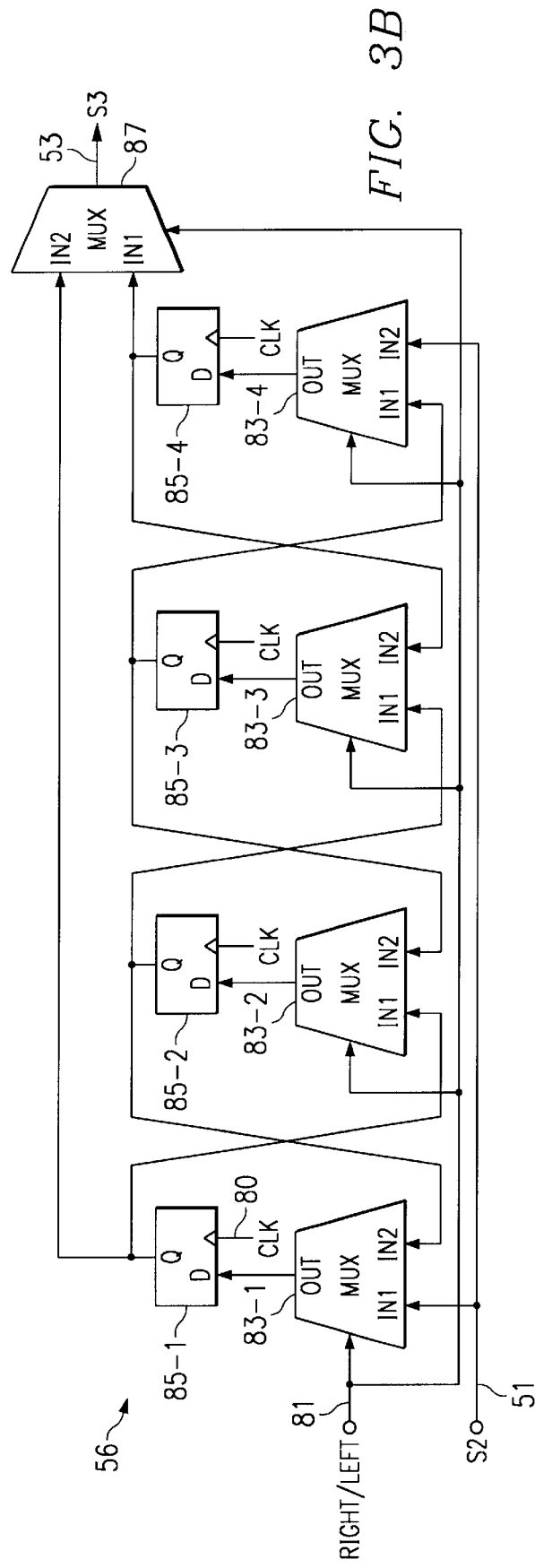
FIG. 3B is a block diagram of the bidirectional shift register 56 of FIG. 3A.

Section 56 includes flip-flops FF9, FF10, FF11, and FF12 connected as shown in FIG. 3B as a 4-bit bidirectional shift register. The input of bidirectional shift register 56 is connected to conductor 51, and its output produces a signal S3 on conductor 53, which is connected to a second input of adder 59.

Section 58 includes FF13, FF14, FF15, and FF16, with the input of flip-flop 13 being connected to conductor 51 and the output of flip-flop FF16 producing a signal S4 on conductor 55, which is connected to a second input of adder 57.

Control circuitry 70 provides a signal CLK on conductor 79 to the 16 tap shift register 51, and also provides control signals on multiconductor bus 77 to control the direction of data shifting in row 56, as subsequently explained. The output of adder 57 is applied to an input of Add/Sub/Null circuit 60. Add/Sub/Null circuit 60 has a second input connected by multi-conductor bus 61 to an output of a ROM (read only memory) 68, which, when properly addressed via bus 75 by control circuitry 70, produces a first coefficient value on multi-conductor bus 61. The output of adder 59 is connected to one input of an Add/Sub/Null circuit 62 having a second input connected by multi-conductor bus 63 to another output of ROM 68, which produces a second coefficient value on conductor 63. Since the data in the presently described embodiment of the invention is only one bit wide, pre-adding the two corresponding bits, paired as described above, results in only three different signals. Therefore, the required multiplication by a coefficient can be accomplished in a simple manner, by adding the coefficient to, subtracting the coefficient from, or performing a null operation on, the contents of an accumulator register. However, if multi-bit data is shifted through the shift register, then true multipliers rather than the Add/Sub/Null circuits, are required.

Add/Sub/Null circuit 60 has a multi-conductor output 65 connected to parallel inputs of an accumulator 64. The accumulator 64 has an output 69 connected to one input of an adder 72. Add/Sub/Null circuit 62 has a multi-conductor output 67 connected to parallel inputs of an accumulator 66. Accumulator 66 has an output 71 connected to another input of adder 72. Adder 72 produces a decimated output signal OUT on conductor 73. Accumulator 64 and accumulator 66 constitute a composite accumulator circuit 74, which receives a control signal via conductor 76 and the clock signal CLK from control circuitry 70. At the beginning of each numerical sequence producing output data, control circuitry 70 produces a signal on conductor 76 to clear or reset the composite accumulator circuit 74. Then control circuitry 70 causes add/subtract/null operations to be performed by Add/Sub/Null circuits 60 and 62 on the outputs of adders 57 and 59, respectively, and causes the results thereof to be accumulated in accumulators 64 and 66, respectively. At the end of those operations, the result is output as data. One clock period later the composite accumulator 74 is reset, and the process is repeated. A detailed logic diagram of Add/Sub/Null circuit 60 is shown in subsequently described FIG. 3C.

FIG. 3B shows an embodiment of the bidirectional shift register 56 implemented by using a plurality of 2-to-1 multiplexers and a plurality of flip-flops. Referring to FIG. 3B, bidirectional shift register 56 includes four D-type flip-flops 85-1, 85-2, 85-3, and 85-4, each having a clock input connected by conductor 80 to the system clock signal CLK. The D inputs of flip-flops 85-1, 85-2, 85-3, and 85-4 are connected to the outputs of four 2-to-1 multiplexers (referred to as 2-1 multiplexers) 83-1, 83-2, 83-3, and 83-4, respectively. Each of multiplexers 83-1,2,3,4 has a direction input connected by conductor 81 to a left/right direction signal. Conductor 81 also is connected to the direction input of an output 2-1 multiplexer 87. Each of multiplexers 83-1,2,3,4 has a first input IN1 and a second input IN2, one of which is switched to the output of the subject multiplexer depending on the level of the left/right direction signal on conductor 81. The first input of multiplexer 83-1 is connected by conductor 51 to the signal S2 and also to the second input of multiplexer 83-4. The second input of multiplexer 83-1 is connected to the output Q of multiplexer 85-2 and to the first input of multiplexer 83-3. The first input of multiplexer 83-2 is connected to the Q output of flip-flop 85-1 and to the second input IN2 of output multiplexer 87. The second input of multiplexer 83-2 is connected to the Q output of multiplexer 85-3 and to the first input of multiplexer 83-4. The second input of multiplexer 83-3 is connected to the Q output of multiplexer 85-4 and to the first input IN1 of output multiplexer 2-1. The output of output multiplexer 87 is connected to above described conductor 53 to conduct the signal S3. Of course, those skilled in part can easily provide various different implementations of bidirectional shift register 56.

Figure 3C:
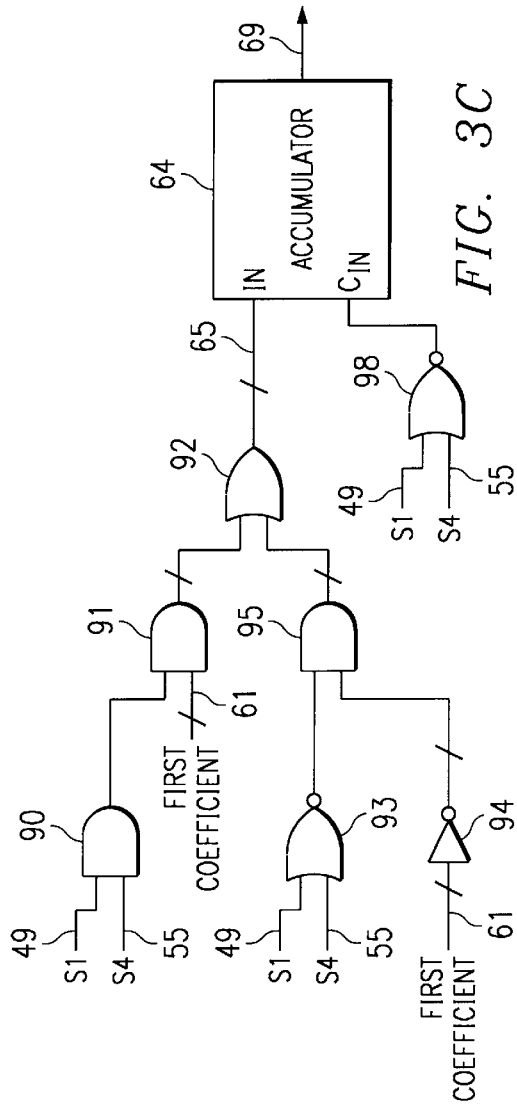
FIG. 3C is a logic diagram of the combination of pre-adders 57, add/subtract/null circuit 60, and accumulator 64 used in FIG. 3A.

Referring to FIG. 3C, the circuitry 57,60,64 includes pre-adder 57, Add/Subtract/Null circuit 60, and accumulator 64, with conductors 49 and 55 connected to the two inputs of a two-input AND gate 90, the output of which is connected to a first input of each of a bank of two-input AND gates 91. The second input of each of two-input AND gates 91 is connected to a corresponding one of a plurality of conductors 61 which conduct the first coefficient from the output of read only memory 68 in FIG. 3A. In one actual implementation of the invention, the number of conductors 61 conducting the first coefficient is equal to 25. The outputs of the bank of AND gates 91 are connected, respectively, to a plurality of inputs of a bank of OR gates 92, the outputs 65 of which are connected to parallel inputs of accumulator 64.

Conductors 49 and 55 also are connected to the two inputs, respectively, of a two-input NOR gate 93, the output of which is connected to a first input of a bank of two-input AND gates 95, the outputs of which are connected, respectively, to the second inputs of each of the NOR gates 92. The second input of each of the bank of AND gates 95 is connected to an output of a corresponding inverter 94. The inputs of the bank of inverters 94 are connected, respectively, to the conductors 61 conducting the first coefficient.

The carry in input of accumulator 64 is connected to the output of a two-input NOR gate 98, the inputs of which are connected to conductors 49 and 55, which conduct S1 and S4, respectively.

If S1 and S4 are both at a logical "0", then the circuitry of FIG. 3C subtracts the first coefficient on conductors 61 from the contents of accumulator 64. If S1 and S2 both are at a logical "1", then the circuitry of FIG. 3C adds the first coefficient on conductors 61 to the contents of accumulator 64. If S1 is a "0" and S4 is a "1" or vice versa, then the outputs 65 of the bank of NOR gates 92 outputs all "0"s which are added to the contents of accumulator 64.

It may be helpful to understand that when S1 and S4 are both equal to a logical "0", the circuit of FIG. 3C produces the inverted value of the first coefficient. The output of NOR gate 98 is applied to the carry in input of accumulator 64 and is at a logical "1". This results in subtraction of the first coefficient from the contents of the accumulator 64. The other three possible values of S1 and S2 result in a logical "0" at the output of NOR gate 98. This results in addition of the number on conductors 65 to the contents of accumulator 64 (when the first coefficient and accumulator contents are expressed in two's complement format). When S1 and S4 both are at a logical "1", then the value of the first coefficient is replicated on conductors 65, and this value is added to the contents of accumulator 64. (It should be noted that those skilled in the art could readily provide the function accomplished by the circuit of FIG. 3C in various other ways.)

In operation, FIR decimation filter 50 of FIG. 3A pairs up the data in 16-tap shift register 51 so as to reduce the number of required multiplications by one-half. In order to pair up the data properly, the direction of data in the top row 56 of the bottom half 56, 58 of shift register 51 is reversed for every 4-bit shifting operation, where every 4-bit shifting operation consists of shifting a number (equal to the decimation ratio) of successive additional bits of the input IN into shift register 51.

Note that this basic algorithm and structure apply regardless of what the decimation ratio R is and regardless of how many bits are included in the shift register 51. The shift register (i.e., shift register 51), is always divided into an upper half and a lower half, the input data IN is shifted into one end of the top row of flip-flops of the upper half, and the top row of flip-flops of the bottom half always is part of the above mentioned bidirectional shift register. That always results in the desired pairing of bits to be pre-added.

The number of taps of the shift register is divided by the decimation ratio, and the result is rounded up to the next higher integer in order to determine the number of rows or slices into which shift register 51 is divided. The width, i.e., the number of bits, of each of row or slice is equal to the decimation ratio. The bits paired are the bits at symmetrically opposite row ends of the upper half and lower half of the shift register. The most recent data, i.e., the data bits having the largest values of the index I indicated in subsequently described FIGS. 4A–D, always appear at the "left" ends of the rows of flip-flops in the "upper" half of the shift register, and the data bits having the largest values of the index I always appear at the "right" ends of the rows of flip-flops in the "lower" half of the shift register. It is the alternating of the direction of data shifting in bidirectional shift register 56 every other 4-bit operation shifting the input data IN which makes that happen.

In the case of 1-bit wide data, the result of the pre-adding is simply to determine whether to add a coefficient, subtract the coefficient, or do nothing. The result of this determination is equivalent to multiplying by the coefficient, so Add/Sub/Null circuits 60 and 62 are provided for this operation. Control circuitry 70 provides appropriate control signals to the 4-bit shift register rows 52, 54, 56 and 58, ROM 68, and accumulators 64 and 66. Accumulators 64 and 66 operate in parallel for each operation, so as to accumulate the output of the Add/Sub/Null circuits 60 and 62 and to clock out multiple accumulated outputs at the end of an operation. The outputs of the parallel accumulators 64 and 66 are summed by adder 72 to produce a filtered, decimated output OUT.

FIGS. 4A–D illustrate the above operation by indicating the flow of data through row shift registers 52, 54, 56, and 58 during the sequential stages of operation. Bidirectional shift register 56 changes direction after every 4-bit shifting operation so as to properly align the output streams S1, S2, S3 and S4 for the pre-adding function every (4 being the decimation ratio).

Figure 4A:
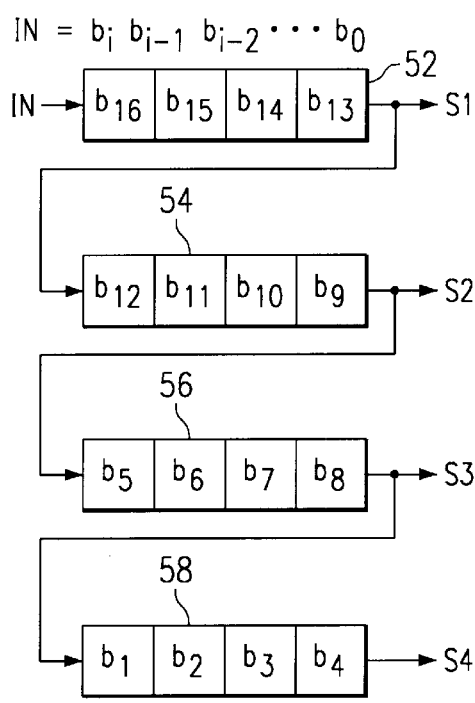
FIGS. 4A–D are block diagrams illustrating the operation of the FIR decimation filter of FIG. 3A.

In FIGS. 4A–D it is assumed that a serial stream of input data $b_i, b_{i-1}, b_{i-2} \ldots b_1$ represented by IN is being shifted in 4-bit groups into the input of 16-bit shift register 51. In FIG. 4A, bits $b_{16,15,14,13}$ of the serial stream are present in row shift register 52, which consists of flip-flops FF1,2,3,4. Bits $b_{12,11,10,9}$ are stored in row shift register 54, bits $b_{5,6,7,8}$ are stored in row shift register 56, and bits $b_{1,2,3,4}$ are stored in row shift register 58, as shown.

Figure 4B:
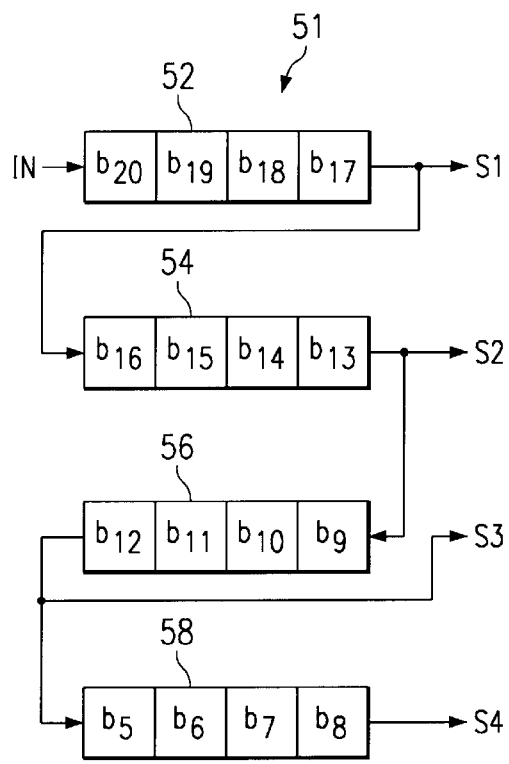

FIG. 4B illustrates the location of the various bits of IN after bits $b_{20,19,18,17}$ have been shifted from left to right into flip-flops 52. This causes bits $b_{16,15,14,13}$ to be shifted from left to right into flip-flops 54. The direction of data flow through bidirectional shift register 56 is reversed from the previous 4-bit group of input bits, so bits $b_{12,11,10,9}$ are shifted from right to left into flip-flops 56. Bits $b_{5,6,7,8}$ are shifted from left to right into flip-flops 58.

Figure 4C:
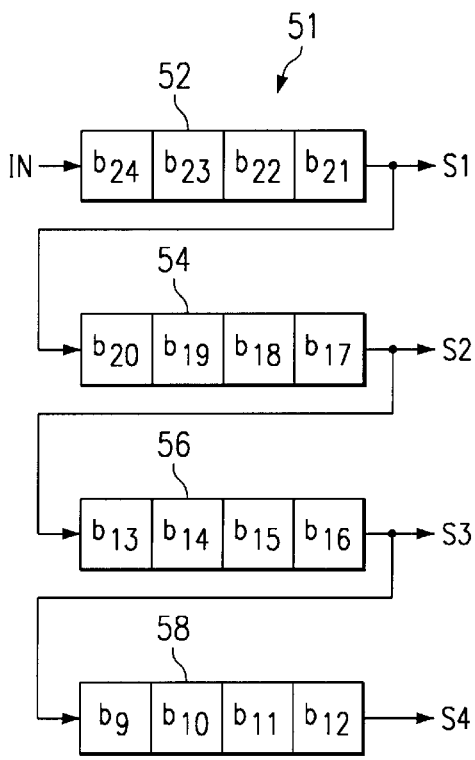

FIG. 4C illustrates the location of the various bits of IN after bits $b_{24,23,22,21}$ have been shifted from left to right into flip-flops 52, causing bits $b_{17,18,19,20}$ to be shifted from left to right into flip-flops 54, bits $b_{13,14,15,16}$ to be shifted into flip-flops 56, and bits $b_{9,10,11,12}$ to be serially shifted into flip-flop 58.

Figure 4D:
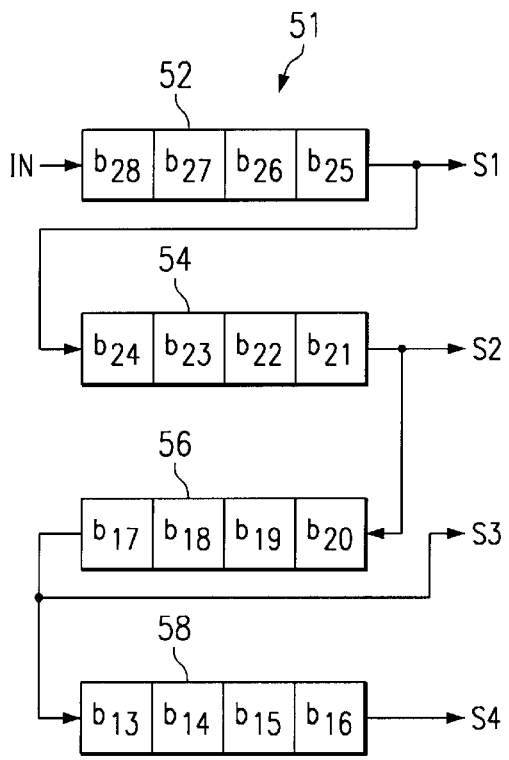

FIG. 4D illustrates the location of the various bits of IN after bits $b_{28,27,26,25}$ have been shifted from left to right into flip-flops 52, bits $b_{24,23,22,21}$ have been shifted from left to right into flip-flops 54, bits $b_{20,19,18,17}$ have been shifted from right to left into flip-flops 56, and bits $b_{16,15,14,13}$ have been shifted from left to right into flip-flops 58. The configuration shown in FIG. 4D shows bit $b_{25}$ properly aligned with bit $b_{16}$ so it can be pre-added by adder 59, and also shows bit $b_{21}$ properly aligned with bit $b_{17}$ to be pre-added by adder 59. This is consistent with the above-described algorithm, and which the most recent bits, i.e., the bits with the largest index I, appear at the left ends of the rows 52 and 54 in the upper half of shift register 51 and at the right ends of the rows 56 and 58 in the lower half of shift register 51. Note that the ideas of the rows or sections 52, 54, 56, and 58 being "upper", "lower", "right", and "left" as described above are purely conceptual. Actually, is only necessary that the shift register 51 is capable of having an "upper" portion and a "lower" portion and that is theoretically capable of being divided into upper, lower, right, and left rows or sections as described.

Figure 5:
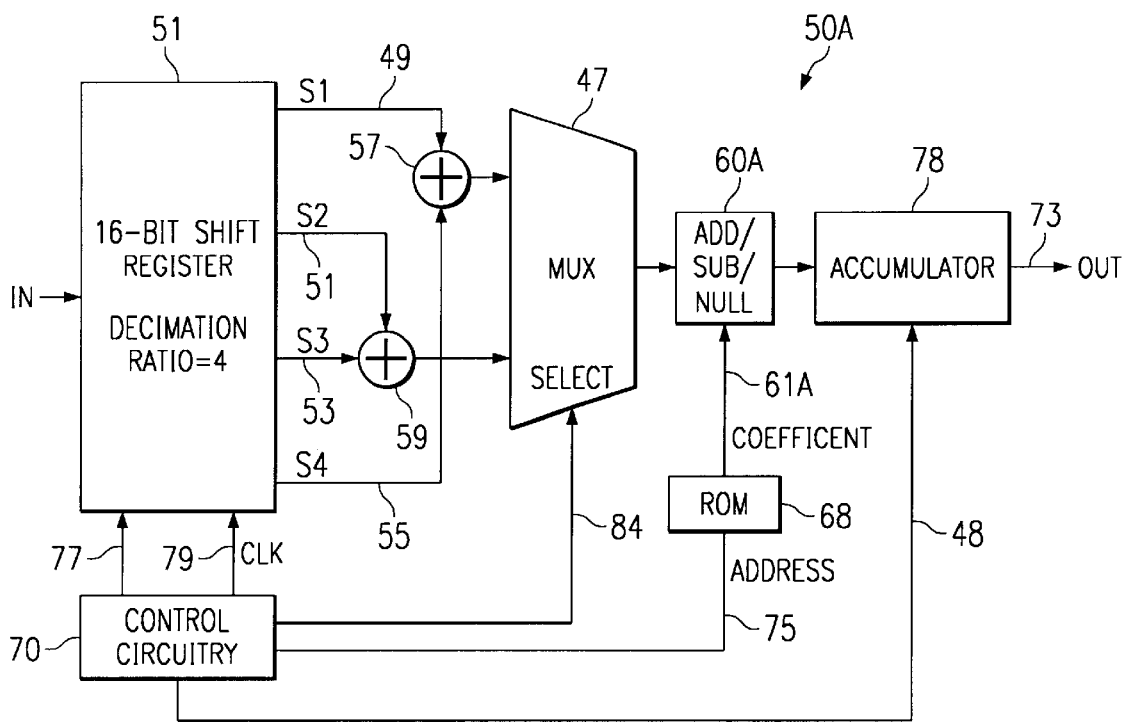
FIG. 5 is a block diagram of an alternative FIR decimation filter according to the present invention.
Figure 2:
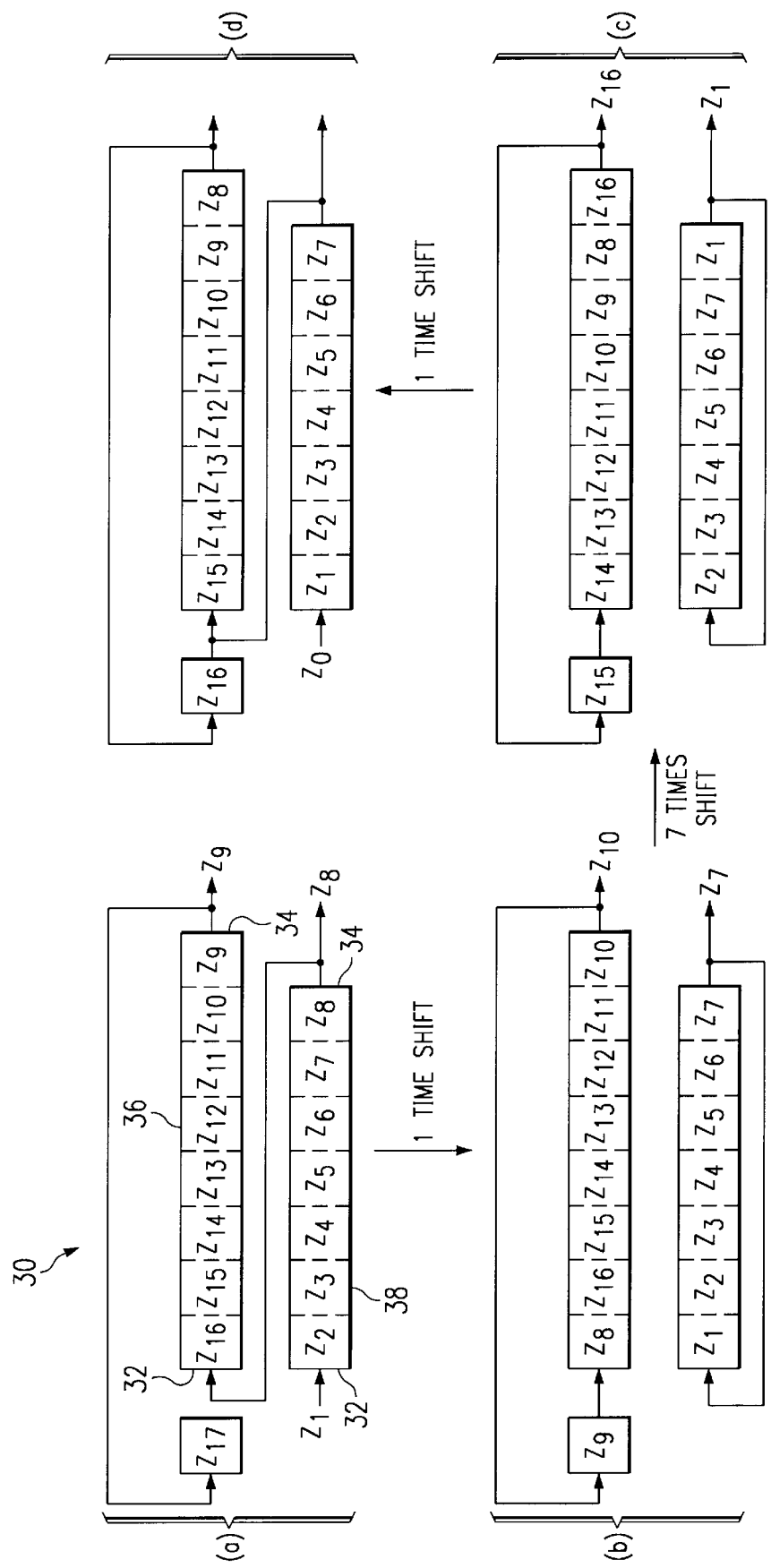
FIG. 2 is a sequence of data flow diagrams useful in explaining the operation of a prior art "dual-loop shift register" FIR filter.

FIG. 5 shows an alternative structure to that of FIG. 3A. Referring to FIG. 5, FIR decimation filter 50A is similar in structure to that of FIR decimation filter 50 of FIG. 3A except that the outputs of adders 57 and 59 were are connected to inputs of a multiplexer 47 instead of two Add/Sub/Null circuits 60 and 62, and the accumulator structure 74 of FIG. 3A has been replaced by an accumulator circuit 78 shown in FIG. 5. In FIG. 5, the selection input of multiplier 47 is connected to receive a double-frequency control signal on conductor 84 from control circuitry 70. The output of multiplexer 47 is connected to one input of a single Add/Sub/Null circuit (or multiplier circuit) 60A, the other input of which receives a coefficient signal on multiconductor bus 61A from the output of the ROM 68. The output of Add/Sub/Null circuit 60A is connected to the data input of accumulator 78. Control circuitry 70 produces a double frequency accumulator control signal on conductor 48 which is applied to the control input of accumulator 78. The output of accumulator 78 produces the decimated output signal OUT on conductor 73. The circuit structure shown in FIG. 5 reduces the overall circuit cost by allowing hardware, including Add/Subtract/Null circuit 60A and accumulator 78, to be shared.

In accordance with the present invention, providing the bidirectional shift register row 56 and altering the direction of the data stream therein avoids the need to use a feedback loop as required in the prior art. The technique of providing a bidirectional shift register row and altering the direction of the data stream has a further advantage that the clock speed of the shift registers can be seen as the speed at which the incoming data is clock into the shift registers.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

What is claimed is:

1. An FIR decimation filter comprising:
    (a) a shift register including M flip-flops arranged in M/R rows of R bits each, wherein M/R is an integer and R is the decimation ratio of the FIR decimation filter, the shift register having an input for receiving serial digital input information, half of the rows being sequentially arranged in an upper section, a second half of the rows being arranged sequentially in a lower section, each row having a left tap and a right tap;
    (b) a bidirectional shift register included in the shift register including a one of the rows located at the top of the lower section;
    (c) control circuitry for controlling the a shifting operations to shift input data and data present in the shift register by R bits for each shifting operations so as to load a new group of R bits into each row;
    (d) M/(2R) pre-adders each having first and second inputs connected to the right tap points of symmetrically opposite rows of the upper section and lower section, respectively;
    (e) arithmetic circuitry coupled to outputs of the pre-adders for receiving output information from the pre-adders and for receiving coefficient information and effectively multiplying the output information by the coefficient information; and (f) accumulator circuitry coupled to accumulate information from an output of the arithmetic circuitry and output the accumulated information as a filtered, decimated representation of the serial digital input information.

2. The FIR decimation filter of claim 1 wherein the flip-flops are D-type flip-flops.

3. The FIR decimation filter of claim 1 wherein the serial digital information is one bit wide, and wherein the arithmetic circuitry includes a first addition/subtraction/null circuit for adding the coefficient information to the contents of the accumulator circuitry, subtracting the coefficient information from the contents of the accumulator circuitry, or neither, depending on the output of one of the pre-adders.

4. The FIR decimation filter of claim 3 wherein the first addition/subtraction/null circuit has an input coupled to an output of a first pre-adder, and the arithmetic circuitry includes a second addition/subtraction/null circuit having input coupled to an output of a second pre-adder and an output coupled to a second input of the accumulator circuitry.

5. The FIR decimation filter of claim 4 wherein the accumulator circuitry includes a first accumulator and a second accumulator, the first accumulator having an input coupled to the output of the first addition/subtraction/null circuit, the second accumulator having an input coupled to the output of the second addition/subtraction/null circuit, the outputs of the first and second addition/subtraction/null circuits being coupled to first and second inputs, respectively, of an adder circuit to output the accumulated information is the filtered, decimated representation of the serial digital input information.

6. The FIR decimation filter of claim 1 wherein the arithmetic circuitry includes at least one multiplier circuit coupled to receive output information from at least one of the pre-adders and an output coupled to the accumulator circuitry.

7. The FIR decimation filter of claim 1 including a and a read only memory coupled to receive a coefficient information addresses from the control circuitry, the read only memory storing addressable coefficient information, the read only memory having an output coupled to the arithmetic circuitry.

8. The FIR decimation filter of claim 1 including a the multiplexer circuit having first and second inputs coupled to outputs of a plurality of the pre-adders and an output coupled to an input of the arithmetic circuitry, the multiplexer circuit including a channel selection input coupled to an output of the control circuitry for receiving an increased-frequency channel selection signal from the control circuitry, the accumulator circuitry having a control input coupled to receive an increased-frequency control signal from the control circuitry.

9. The FIR decimation filter of claim 1 wherein the bidirectional shift register includes R flip-flops and multiplexing circuitry including a direction control input coupled to the control circuitry and also including outputs and selectable inputs connected ball to the outputs in response to a direction control signal received from the control circuitry, the outputs of the multiplexing circuitry being coupled to inputs of the flip-flops, respectively, and the various inputs of the multiplexing circuitry being coupled to outputs of the various R flip-flops so as to shift data output by a one of the rows located at the bottom of the upper section through the R-flops in directions determined by the control circuitry.

10. An FIR decimation filter comprising:
(a) a shift register including M flip-flops arranged in M/R row sections which can be conceptualized as rows of R bits each, wherein M/R is an integer and R is the decimation ratio of the FIR decimation filter, the shift register having an input for receiving serial digital input information, half of the row sections being sequentially arranged in a first major section which can be conceptualized as an upper section, a second half of the row sections being arranged sequentially in a second major section which can be conceptualized as a lower section, each row sections having a first end tap which can be conceptualized as a left tap and a second end tap which can be conceptualized as a right tap;
(b) a bidirectional shift register in one of the M/R row sections located in the second major section at a location thereof which can be conceptualized as a top of the second major section;
(c) control circuitry for controlling the a shifting operations to shift input data and data present in the shift register by R bits for each shifting operations so as to load a new group of R bits into each row section;
(d) M/(2R) pre-adders each having first and second inputs connected to the right tap points of symmetrically opposite row sections of the first major section and second major section, respectively;
(e) arithmetic circuitry coupled to outputs of the pre-adders for receiving output information from the pre-adders and for receiving coefficient information and effectively multiplying the output information by the coefficient information; and
(f) accumulator circuitry coupled to accumulate information from an output of the arithmetic circuitry and output the accumulated information as a filtered, decimated representation of the serial digital input information.

11. A method of operating an FIR decimation filter, comprising:
(a) providing a shift register including M flip-flops arranged in M/R rows of R bits each, wherein M/R is an integer and R is the decimation ratio of the FIR decimation filter, the shift register having an input for receiving serial digital input information, half of the rows being sequentially arranged in an upper section, a second half of the rows being arranged sequentially in a lower section, each row having a left tap and a right tap;
(b) performing shifting operations in which R bits of the input information are shifted into a first row at the top of the upper section during each shifting operations, such that a group of R new bits appear in each row, respectively, as a result of each shifting operation;
(c) reversing a direction of shifting all of the R bits from the bottom row of the upper section through the top row of the bottom section 4 every shifting operation;
(d) pre-adding information from the right taps of the rows by means of M/(2R) pre-adders each having first and second inputs connected to the right tap points of symmetrically opposite rows of the upper section and lower section, respectively;
(e) operating arithmetic circuitry coupled to outputs of the pre-adders for receiving output information from the pre-adders to effectively multiply the output information by predetermined FIR coefficient information; and
(f) accumulating information from an output of the arithmetic circuitry and outputting the accumulated information at a predetermined decimated rate.

* * * * *